(12) United States Patent
Ogawa et al.

(10) Patent No.: US 8,234,596 B2
(45) Date of Patent: Jul. 31, 2012

(54) PATTERN DATA CREATING METHOD, PATTERN DATA CREATING PROGRAM, AND SEMICONDUCTOR DEVICE MANUFACTURING METHOD

(75) Inventors: Ryuji Ogawa, Kanagawa (JP); Masahiro Miyairi, Kanagawa (JP); Shimon Maeda, Tokyo (JP); Suigen Kyoh, Kanagawa (JP); Satoshi Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 421 days.

(21) Appl. No.: 12/552,010

(22) Filed: Sep. 1, 2009

(65) Prior Publication Data

US 2010/0081294 A1 Apr. 1, 2010

(30) Foreign Application Priority Data

Sep. 29, 2008 (JP) .................................. 2008-250293

(51) Int. Cl.
*G06F 17/50* (2006.01)

(52) U.S. Cl. ................. 716/50; 716/51; 716/52; 716/53; 716/54; 716/55

(58) Field of Classification Search ................ 716/50–56
See application file for complete search history.

(56) References Cited

U.S. PATENT DOCUMENTS

| 7,313,769 | B1 | 12/2007 | Lukanc et al. |
| 2008/0270956 | A1 | 10/2008 | Murakami |
| 2009/0077524 | A1* | 3/2009 | Nagamura et al. ............... 716/19 |

FOREIGN PATENT DOCUMENTS

| JP | 6-35171 | 2/1994 |
| JP | 2007-057948 | 3/2007 |
| JP | 2008-145691 | 6/2008 |
| JP | 2009-181053 | 8/2009 |
| WO | WO 2008-023660 A1 | 2/2008 |

OTHER PUBLICATIONS

Notice of Rejection issued by the Japanese Patent Office on Nov. 16, 2010, for Japanese Patent Application No. 2008-250293, and English-language translation thereof.

* cited by examiner

*Primary Examiner* — Paul Dinh

(74) *Attorney, Agent, or Firm* — Finnegan, Henderson, Farabow, Garrett & Dunner, L.L.P.

(57) ABSTRACT

A pattern data creating method according to an embodiment of the present invention comprises: extracting marginal error patterns using a first result obtained by applying process simulation to mask pattern data based on an evaluation target cell pattern, applying the process simulation to mask pattern data based on an evaluation target cell pattern with peripheral environment pattern created by arranging a peripheral environment pattern in the marginal error patterns such that a second result obtained by creating mask pattern data and applying the process simulation to the mask pattern data is more deteriorated than the first result, and correcting the evaluation target cell pattern or the mask pattern data based on the evaluation target cell pattern when there is a fatal error.

15 Claims, 10 Drawing Sheets

(BEST CONDITION)

OK (UNDER CONDITION)

75.5 nm

OK (BEST CONDITION)

OK (UNDER CONDITION)

66.75 nm

FATAL

FIG.6A
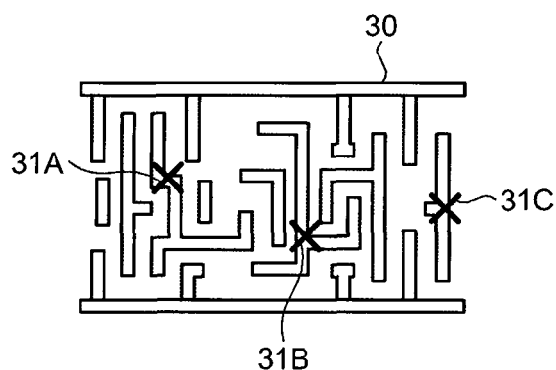
FIG.6B
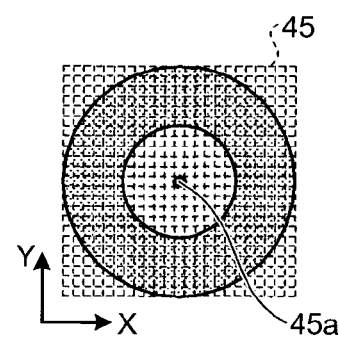
FIG.6C
| X | Y | VALUE |
|---|---|---|
| 0 | 0 | 0 |
| 0 | 0.1 | 0 |
| 0 | 0.2 | 0 |
| 0 | 0.3 | 0 |
| 0 | 0.4 | 0 |
| 0 | 0.5 | 0 |
| 0 | 0.6 | 1 |
| : | : | : |
FIG.6D
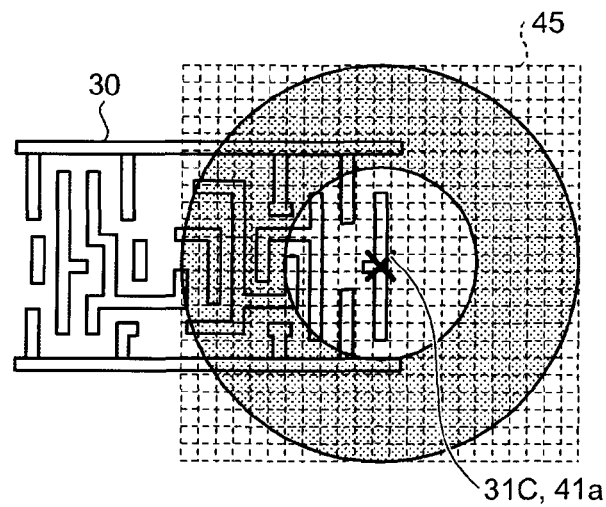

PATTERN DATA CREATING METHOD, PATTERN DATA CREATING PROGRAM, AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2008-250293, filed on Sep. 29, 2008; the entire contents of which are incorporated herein by reference.

BACKGROUND OF THE INVENTION

1. Field of the Invention

The present invention relates to a pattern data creating method, a pattern data creating program, and a semiconductor device manufacturing method.

2. Description of the Related Art

According to the refining of semiconductor integrated circuits in recent years, a dimension equal to or larger than a half of a light source wavelength of a light exposing device is demanded as a minimum line width on the semiconductor integrated circuits. Because of such refining, a phenomenon in which, even if a mask pattern formed on a photomask as specified by a circuit design drawing is exposed to light and transferred onto a wafer, a pattern of a desired shape cannot be transferred, i.e., a phenomenon called optical proximity effect is becoming obvious. To solve such a problem, a technique for finishing a shape after transfer as specified by a desired design pattern when a mask pattern formed on a photomask is transferred onto a wafer (hereinafter, "optical proximity correction (OPC)") is generally carried out. When the OPC is used, lithography verification for evaluating whether a circuit pattern exactly the same as a design pattern can be formed by a mask pattern manufactured through the OPC is performed (see, for example, Japanese Patent Application Laid-Open No. 2007-57948).

In semiconductor manufacturing processes such as lithography and etching processes, other circuit patterns arranged around a circuit pattern desired to be formed (hereinafter, "peripheral patterns") substantially affect dimension accuracy of the circuit pattern desired to be formed. Therefore, process evaluation is performed with conceivable finite number of peripheral patterns arranged around the circuit pattern desired to be formed and correction or the like of the circuit pattern desired to be formed is performed to prevent problems from occurring.

However, even if no problem occurs in the process evaluation by the arrangement of the finite number of peripheral patterns in the past, an unexpected fatal error may occur in process evaluation in designing because of an unassumed arrangement variation (a peripheral pattern environment) in an actual product. To prevent such an error, it is acceptable if evaluation by a peripheral pattern environment assumed for an evaluation target cell pattern ends in a realistic evaluation time. However, when variations of cells and patterns arranged around the circuit pattern desired to be formed are infinitely assumed, it is impossible to realistically evaluate the variations.

BRIEF SUMMARY OF THE INVENTION

A pattern data creating method according to an embodiment of the present invention comprises: acquiring a first simulation result obtained by applying process simulation to mask pattern data based on an evaluation target cell pattern on evaluation target data; evaluating, whether marginal error patterns as sections in the evaluation target cell pattern having insufficient margins are present using the first simulation result,; extracting the marginal error patterns; creating an evaluation target cell pattern with peripheral environment pattern in which a peripheral environment pattern is arranged with respect to the marginal error patterns such that a second simulation result obtained when mask data pattern is created and the process simulation is applied to the mask pattern data is more deteriorated than the first simulation result; and determining whether a fatal error is present using a result obtained by applying the process simulation to the mask pattern data based on the evaluation target cell pattern with peripheral environment pattern and correcting, when the fatal error is present, the evaluation target cell pattern including the marginal error patterns or the mask pattern data based on the evaluation target cell pattern.

A pattern data creating method according to an embodiment of the present invention comprises: setting a cell peripheral area in an area of an evaluation target cell pattern affected by patterns arranged around the evaluation target cell pattern on evaluation target data; dividing the cell peripheral area into a plurality of verification areas; selecting one verification area out of the verification areas and generating a peripheral environment pattern that accelerates a neck section or a bridge section present in the verification area in a direction of an error; creating an evaluation target cell pattern with peripheral environment pattern in which the peripheral environment pattern is arranged around the evaluation target cell pattern; applying OPC processing and lithography simulation to the evaluation target cell pattern with peripheral environment pattern to determine whether a fatal error is present; performing, when the fatal error is present, processing for correcting the evaluation target cell pattern; and applying the OPC processing and the lithography simulation to the evaluation target cell pattern with peripheral environment pattern until the fatal error is removed, determining whether a fatal error is present, and repeatedly performing, when the fatal error is present, processing for correcting the evaluation target cell pattern.

A computer program product having a computer-readable recording medium including a plurality of commands for creating process models that can be executed by a computer according to an embodiment of the present invention, the commands causes the computer to execute: evaluating whether marginal error patterns as sections in an evaluation target cell pattern having insufficient margins are present, using a first simulation result obtained by applying process simulation to mask pattern data based on the evaluation target cell pattern on data; extracting the marginal error patterns; creating an evaluation target cell pattern with peripheral environment pattern in which a peripheral environment pattern is arranged with respect to the marginal error patterns such that a second simulation result obtained when mask data pattern is created and the process simulation is applied to the mask pattern data is more deteriorated than the first simulation result; determining whether a fatal error is present using a result obtained by applying the process simulation to the mask pattern data based on the evaluation target cell pattern with peripheral environment pattern; and correcting, when the fatal error is present, the evaluation target cell pattern including the marginal error patterns or the mask pattern data based on the evaluation target cell pattern.

A computer program product having a computer-readable recording medium including a plurality of commands for creating process models that can be executed by a computer according to an embodiment of the present invention, the commands causes the computer to execute: setting a cell peripheral area in an area of an evaluation target cell pattern affected by patterns arranged around the evaluation target cell pattern on evaluation target data; dividing the cell peripheral area into a plurality of verification areas; selecting one verification area out of the verification areas and generating a peripheral environment pattern that accelerates a neck section or a bridge section present in the verification area in a direction of an error; creating an evaluation target cell pattern with peripheral environment pattern in which the peripheral environment pattern is arranged around the evaluation target cell pattern; applying OPC processing and lithography simulation to the evaluation target cell pattern with peripheral environment pattern to determine whether a fatal error is present; performing, when the fatal error is present, processing for correcting the evaluation target cell pattern; and applying the OPC processing and the lithography simulation to the evaluation target cell pattern with peripheral environment pattern until the fatal error is removed, determining whether a fatal error is present, and repeatedly performing, when the fatal error is present, processing for correcting the evaluation target cell pattern.

BRIEF DESCRIPTION OF THE DRAWINGS

FIGS. 6A to 6D are schematic diagrams of another example of the specific procedure of the pattern data creating method performed when a neck error occurs;

DETAILED DESCRIPTION OF THE INVENTION

Figure 1A:
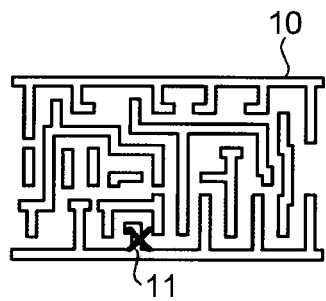
FIGS. 1A to 1F are diagrams for explaining problems in lithography verification.

FIGS. 1A to 1F are diagrams for explaining problems caused by lithography verification. In FIG. 1A, a single evaluation target cell pattern is shown. In this evaluation target cell pattern 10, attention is paid to an X mark section 11. This X mark section 11 is a section in which a transfer pattern is neck-like when mask data is created and lithography is carried out. The width of the neck-like section has to be designed not to be smaller than 72 nanometers as a dangerous section determination reference value set in advance.

Figure 1B:
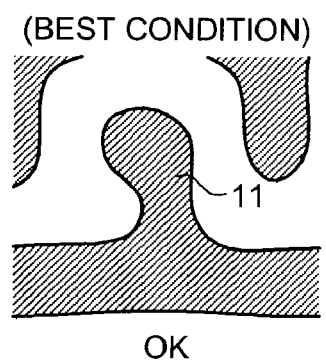
Figure 1C:
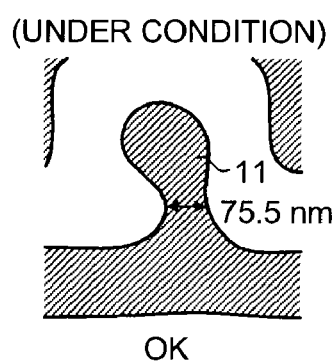

After applying MDP/OPC processing to the evaluation target cell pattern shown in FIG. 1A, a peripheral environment pattern that further deteriorates a dangerous section present in the evaluation target cell pattern is arranged around the evaluation target cell pattern. The evaluation target cell pattern is evaluated in a best focus state and an under focus state. Results of the evaluation in the best focus state and the under focus state are shown in FIGS. 1B and 1C, respectively. As shown in FIG. 1B, in the best focus state, the width of the neck-like X mark section 11 is larger than 72 nanometers and satisfies the dangerous section determination reference value. As shown in FIG. 1C, in the under focus state, the width of the neck-like X mark section 11 is 75.5 nanometers and larger than the dangerous section determination reference value. Therefore, such an evaluation target cell pattern 10 should be a pattern without a problem in the lithography verification in the past.

Figure 1D:
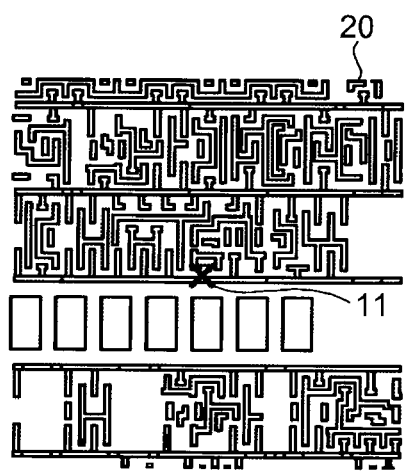
Figure 1E:
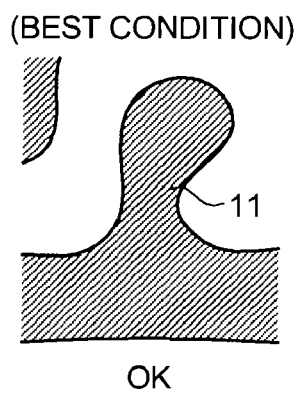
Figure 1F:
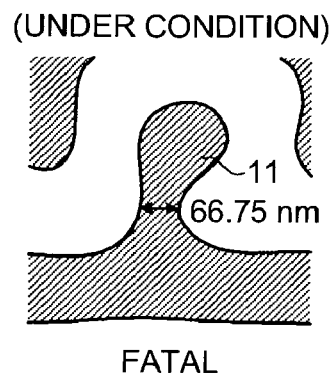

However, in the past, because evaluation is performed with a finite number of peripheral environment patterns, when evaluation target cell patterns are laid out in an actual product in which an infinite number of peripheral environment patterns are likely to be arrayed, the lithography verification may be inapplicable. For example, as shown in FIG. 1D, when the evaluation target cell pattern shown in FIG. 1A is arranged in an actual product 20, as shown in FIG. 1E, in the best focus state, the neck-like X mark section 11 satisfies the dangerous section determination reference value. However, as shown in FIG. 1F, in the under focus state, the width of the neck-like X mark section 11 is 66.75 nanometers and is smaller than the dangerous section determination reference value. This leads to a fatal error. Therefore, in embodiments explained later, a pattern data creating method and a pattern data creating program that can prevent the fatal error from occurring even when evaluation target cell patterns are arranged in an actual product are explained.

In a first embodiment of the present invention, as a result of lithography verification, a position (a pattern) that is not a fatal error but does not have a sufficient margin for possibility of changing to a dangerous section when a condition changes even a little is extracted as a marginal error pattern. A peripheral environment pattern that accelerates the marginal error pattern to the fatal error is arranged around the marginal error pattern to perform lithography verification. The marginal error pattern is a pattern without a peripheral environment margin. The fatal error is a pattern, a transfer pattern of which changes to a dangerous section when a process fluctuates (or even if does not fluctuate). "Accelerating the marginal pattern to the fatal error" means that, when the result of the lithography verification is set as a first simulation result, a second simulation result obtained when mask pattern data is created and lithography simulation is carried out is more deteriorated than the first simulation result. Deterioration means that a design cell and a transfer pattern are estranged from each other (deviate from a tolerance condition).

Figure 2A:
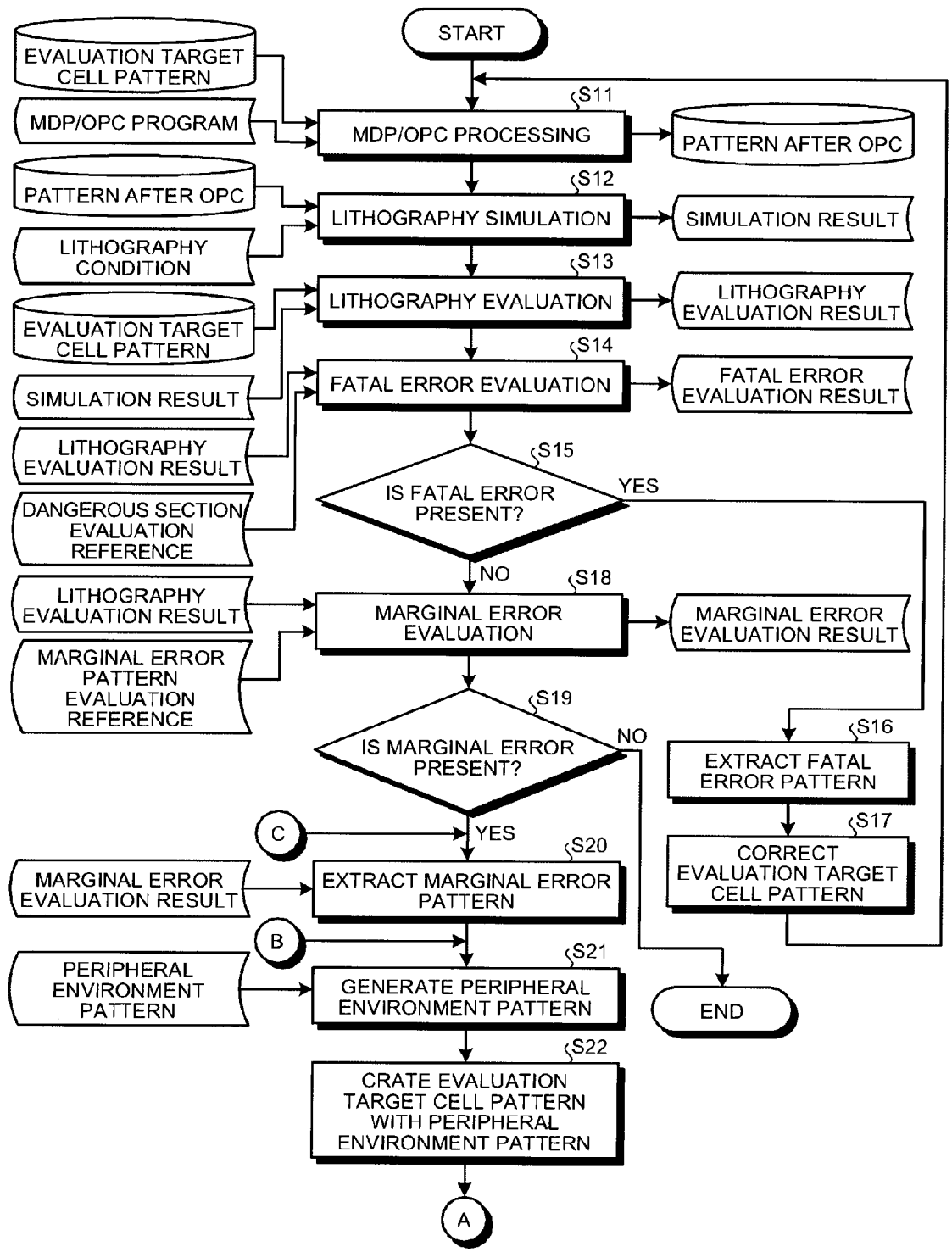
FIGS. 2A and 2B are flowcharts for explaining an example of a processing procedure of a pattern data creating method according to a first embodiment of the present invention.
Figure 2B:
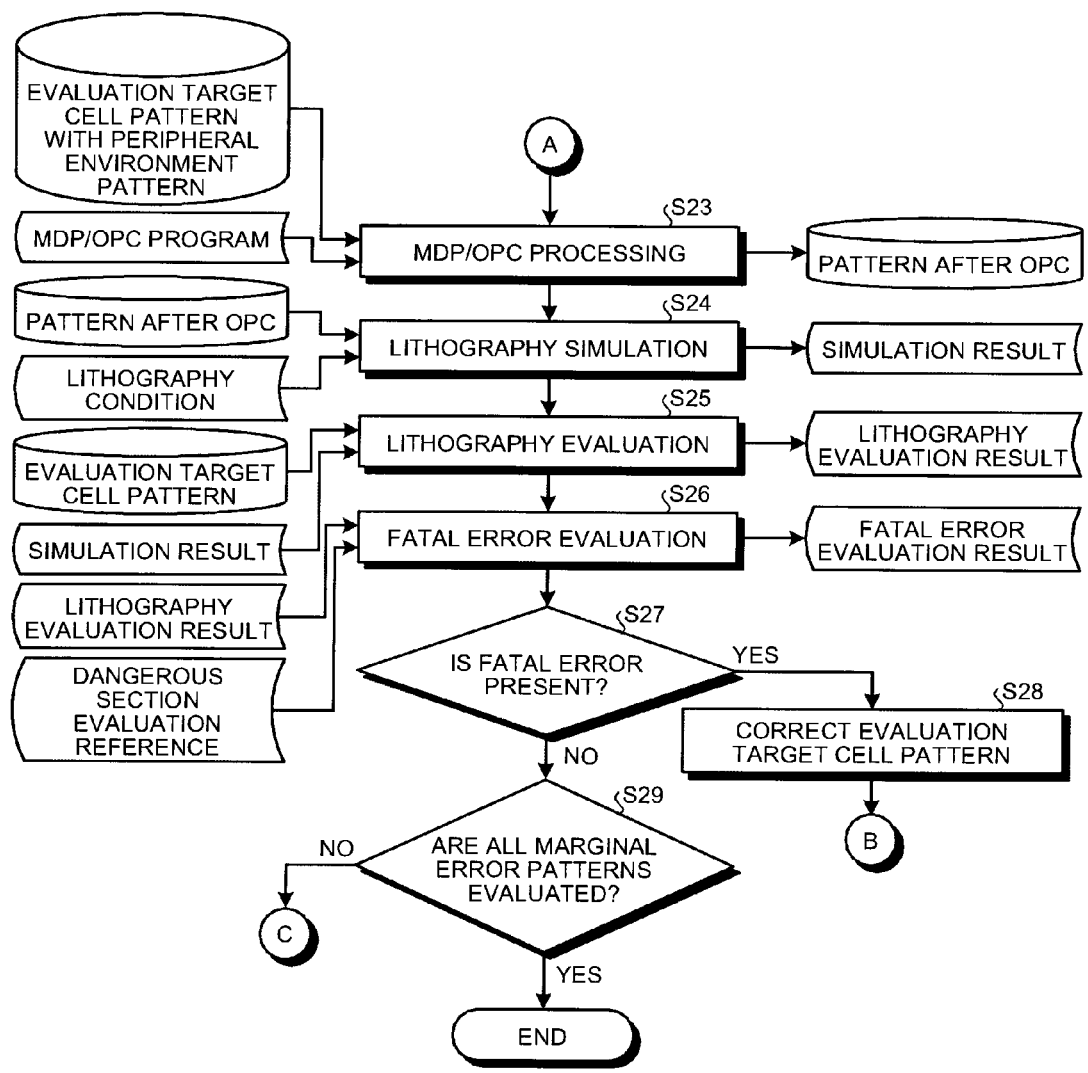

FIGS. 2A and 2B are flowcharts for explaining an example of a processing procedure of a pattern data creating method according to the first embodiment. First, MDP/OPC processing is applied to evaluation target cell patterns as input data and an evaluation target by applying a mask data processing (MDP)/OPC program thereto (step S11) to generate a pattern after OPC. The evaluation target cell pattern is any one of a digital circuit function block cell, an analog circuit function block cell, a memory macro cell, and an input/output circuit cell of a semiconductor integrated circuit. The MDP processing is processing for generating and changing a mask pattern using graphics arithmetic processing, a design rule checker, or the like. The OPC processing is processing for correcting an OPE.

Subsequently, the lithography simulation is performed using, as input data, mask pattern data based on the pattern after OPC and various lithography conditions in which a dosage of light on a resist film, a state of focus, and the like (step S12). Consequently, a simulation result is obtained.

Thereafter, lithography evaluation is performed by using the simulation result and an evaluation target cell pattern (step S13) to obtain a lithography evaluation result. Specifically, a difference between the evaluation target cell pattern and the simulation result obtained by applying the lithography simulation to the pattern after OPC (a difference between a design pattern (evaluation target cell pattern) plane shape and a finish plane shape on a simulated wafer) is calculated. This difference is adopted as a lithography evaluation result.

Fatal error evaluation is performed by using the lithography evaluation result and a dangerous section evaluation reference as input data (step S14) to obtain a fatal error evaluation result. The fatal error evaluation is evaluation for determining whether the difference between the evaluation target cell pattern and the simulation result obtained in the lithography evaluation is within an allowable fluctuation amount set in advance.

Parameters are given to patterns forming the (entire) simulated pattern. Allowable fluctuation amounts are determined in advance for values of the parameters. Examples of the parameters include a relation with patterns in the same layer around the pattern, a relation with patterns present above or below the pattern, a device characteristic, and a shape of the pattern. The allowable fluctuation amount is determined according to, for example, whether a predetermined device characteristic is obtained. An upper limit value and a lower limit value of the allowable fluctuation amount correspond to the dangerous section evaluation reference as an evaluation reference for determining whether a section is a dangerous section. The dangerous section is a condition of occurrence of a problem in terms of a device and is a section that changes to a fatal error that substantially deteriorates yield.

As a result of the fatal error evaluation, when a fatal error is present ("Yes" at step S15), the fatal error (a dangerous section) is extracted (step S16) and the evaluation target cell pattern is corrected (step S17). The processing returns to step S11. The processing is repeatedly performed until the fatal error is removed.

When the fatal error is removed by the processing ("No" at step S15), marginal error evaluation is performed by using the lithography evaluation result and marginal error pattern evaluation reference as in put data (step S18) to obtain a marginal error evaluation result. The marginal error evaluation result is, for example, a coordinate value of a section determined as a marginal error pattern. The marginal error evaluation is a condition that a difference between the evaluation target cell pattern and the simulation result is within the allowable fluctuation amount set in advance but is a problem in terms of a device. The marginal error evaluation is used for determining whether a pattern (a section) that is likely to change to a fatal error is present.

The marginal error evaluation at step S18 is processing for extracting a marginal error pattern that is not fatal but does not have a sufficient margin for possibility of changing to a dangerous section when a condition changes even a little. Therefore, a predetermined range in the allowable fluctuation amount including the upper limit value of the allowable fluctuation amount and a predetermined range in the allowable fluctuation amount including the lower limit value of the allowable fluctuation amount are set as the error pattern evaluation reference. In the marginal error evaluation, when there is a section that satisfies the marginal error evaluation condition, it is determined by using the marginal error evaluation reference that a marginal error occurs.

When other patterns are arranged around the evaluation target cell pattern, patterns closer to the center of the evaluation target cell pattern are less easily affected by the patterns arranged around the evaluation target cell pattern. Patterns closer to a peripheral section are more easily affected by the patterns arranged around the evaluation target cell pattern. Therefore, the marginal error evaluation reference can be changed to a reference that is stricter in a section closer to the peripheral section of the evaluation target cell pattern and is looser in a section farther apart from the peripheral section.

Thereafter, it is determined from the marginal error evaluation result whether a marginal error is present (step S19). When the marginal error is present ("Yes" at step S19), one marginal error pattern is extracted from patterns evaluated as marginal error patterns in the marginal error evaluation results (step S20).

Subsequently, a peripheral environment pattern determined in advance with respect to the evaluation result is generated concerning the extracted marginal error pattern (step S21). The peripheral environment pattern to be generated only has to be a peripheral environment pattern that deteriorates pattern transfer fidelity of the marginal error pattern to be lower than pattern transfer fidelity of a marginal error pattern in the present peripheral environment pattern. In this example, a pattern that deteriorates the pattern transfer fidelity of the marginal error pattern most is used as the peripheral environment pattern. Such a peripheral environment pattern is calculated based on a certain evaluation function. For example, when the marginal error pattern is a neck error, a peripheral environment pattern for reducing the thickness of a neck section of the marginal error pattern is generated. When the marginal error pattern is a bridge error, a peripheral environment pattern that can increase the thickness of adjacent two patterns (reducing a distance between the adjacent two patterns) is generated. In this case, the peripheral environment pattern to be generated also has to be a peripheral environment pattern that deteriorates pattern transfer fidelity of the marginal error pattern to be lower than pattern transfer fidelity of a marginal error pattern in the present peripheral environment pattern. In the above explanation, the pattern transfer fidelity means a degree representing how faithfully to a transfer pattern the shape, the position, the size, and the like of a design pattern are reproduced.

Thereafter, an evaluation target cell pattern with peripheral environment pattern, which is an evaluation target cell pattern that should be evaluated anew, is created by using an evaluation target cell pattern and the generated peripheral environment pattern (step S22). New evaluation target cell pattern data is formed by arranging the peripheral environment pattern such that the center thereof coincides with a position of a marginal error pattern of the evaluation target cell pattern and removing a position of the peripheral environment pattern overlapping the evaluation target cell pattern.

Thereafter, the MDP/OPC processing is applied to the evaluation target cell pattern with peripheral environment pattern by applying the MDP/OPC program thereto (step S23) to generate a pattern after OPC. The lithography simulation is performed by using mask pattern data based on the pattern after OPC and various lithography conditions as input data (step S24) to obtain a simulation result.

The lithography evaluation is performed by using the simulation result obtained at step S24 and the evaluation target cell pattern (step S25) to obtain a lithography evaluation result. Fatal error evaluation is performed by using the lithography evaluation result obtained at step S25 and the dangerous section evaluation reference as input data (step S26) to obtain a fatal error evaluation result. As a result of the fatal error evaluation at step S26, when a fatal error is present ("Yes" at step 27), correction for the evaluation target cell pattern is performed (step S28). Examples of the correction for the evaluation target cell pattern include correction of a design pattern and correction of OPC. Thereafter, the processing returns to step S21. The processing is repeatedly performed until the fatal error is removed.

When a fatal error is not present at step S27 ("No" at step S27), it is determined whether all marginal error patterns extracted in the marginal error evaluation at step S18 are evaluated (step S29). When all the marginal error patterns are not evaluated ("No" at step S29), the processing returns to step S20. The processing is repeatedly executed. When all the marginal error patterns are evaluated ("Yes" at step S29) or when a marginal error is not present at step S19 ("No" at step S19), a probability of occurrence of a fatal error is extremely low even if evaluation target cell patterns are laid out in an actual product. Therefore, the pattern data creating method ends.

Figure 3A:
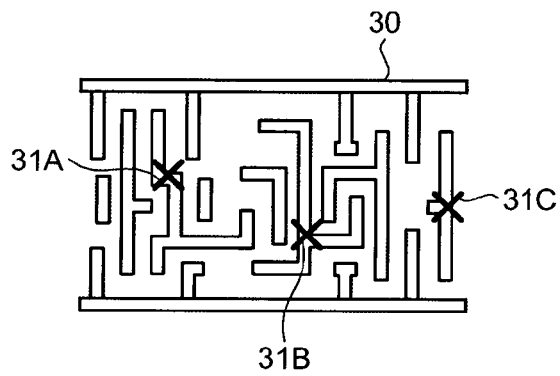
FIGS. 3A to 3D are schematic diagrams of a specific procedure of the method of creating data pattern performed when a neck error occurs.

FIGS. 3A to 3D are schematic diagrams of a specific procedure of the pattern data creating method performed when a neck error occurs. First, creation of an evaluation target cell pattern with peripheral environment pattern is performed concerning an evaluation target cell pattern 30 shown in FIG. 3A. The MDP/OPC processing, the lithography simulation, and the lithography evaluation are applied to mask pattern data based on the evaluation target cell pattern 30. It is assumed that a fatal error is removed by correction. Marginal error evaluation is performed by using a lithography evaluation result and the marginal error pattern evaluation reference. In FIG. 3A, positions of marginal error patterns 31A, 31B, and 31C obtained as a result of the marginal error evaluation are indicated by an X mark. After extraction of the marginal error patterns 31A, 31B, and 31C, correction is performed concerning the evaluation target cell pattern 30.

Figure 3B:
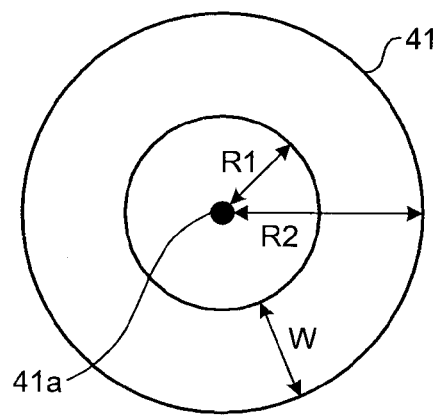

Thereafter, one of the marginal error patterns 31A, 31B, and 31C is selected. It is assumed that the marginal error pattern 31C shown in FIG. 3A is selected. The marginal error pattern 31C is a section in which there is concern about a neck error. Therefore, a peripheral environment pattern for neck 41 shown in FIG. 3B is generated. A ring-like pattern is shown as an example of the peripheral environment pattern for neck 41. The ring-like pattern has an action of reducing the thickness of a pattern arranged in a center 41a of the peripheral environment pattern for neck 41. Optimum values of a radius R1 of an inner circumference of a ring, a radius R2 of an outer circumference of a ring, and width W of the ring are different depending on a layer and a process of an evaluation target cell pattern and whether the evaluation target cell pattern is under condition or over condition. Therefore, values that can reduce the thickness of a pattern arranged in the center 41a most are calculated by an experiment in advance for each of conditions such as the layer and the process of the evaluation target cell pattern and whether the evaluation target cell pattern is under condition or over condition.

Figure 3C:
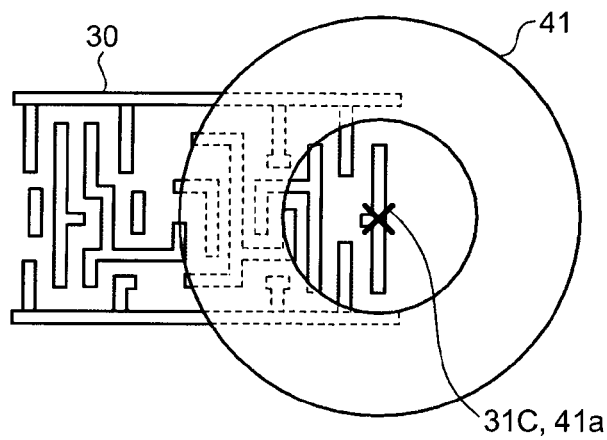
Figure 3D:
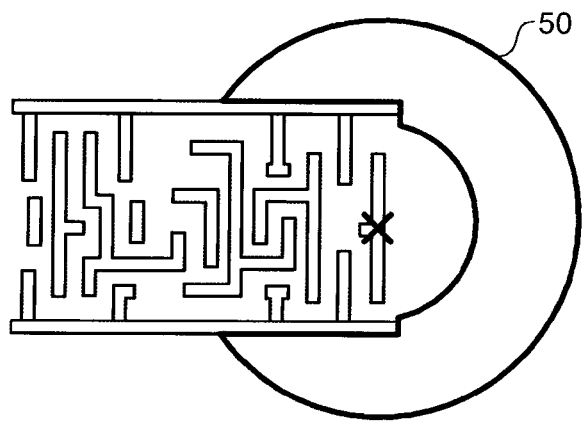

As shown in FIG. 3C, the ring-like peripheral environment pattern for neck 41 is arranged to overlap the evaluation target cell pattern 30 with the center 41a thereof set in the position of the selected marginal error pattern 31C. As shown in FIG. 3D, the ring in the position of the ring-like peripheral environment pattern for neck 41 overlapping the evaluation target cell pattern 30 is removed to create a new evaluation target cell pattern, i.e., an evaluation target cell pattern with peripheral environment pattern 50.

Processing for creating the evaluation target cell pattern with peripheral environment pattern 50 is performed for each of all the extracted marginal error patterns 31A, 31B, and 31C. In other words, evaluation target cell patterns with peripheral environment pattern are created by the number of marginal error patterns.

Figure 4A:
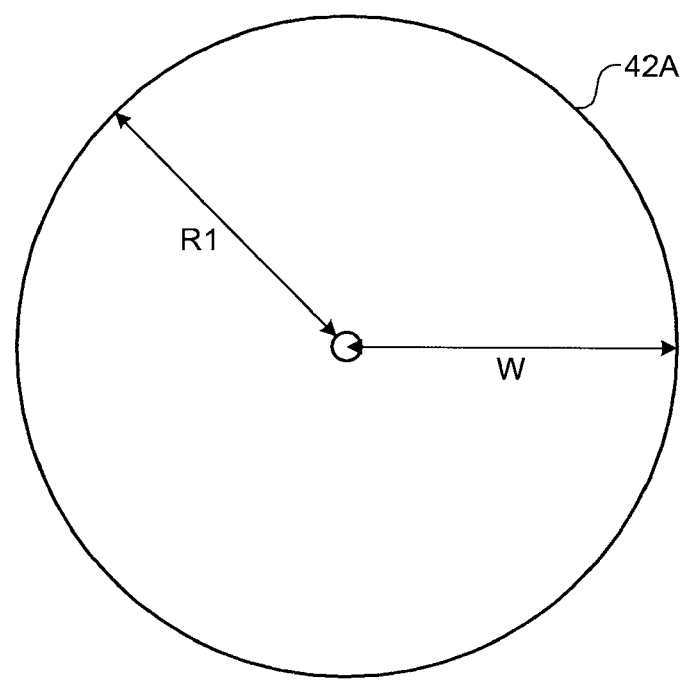
FIGS. 4A and 4B are diagrams of examples of a peripheral environment pattern for bridge.
Figure 4B:
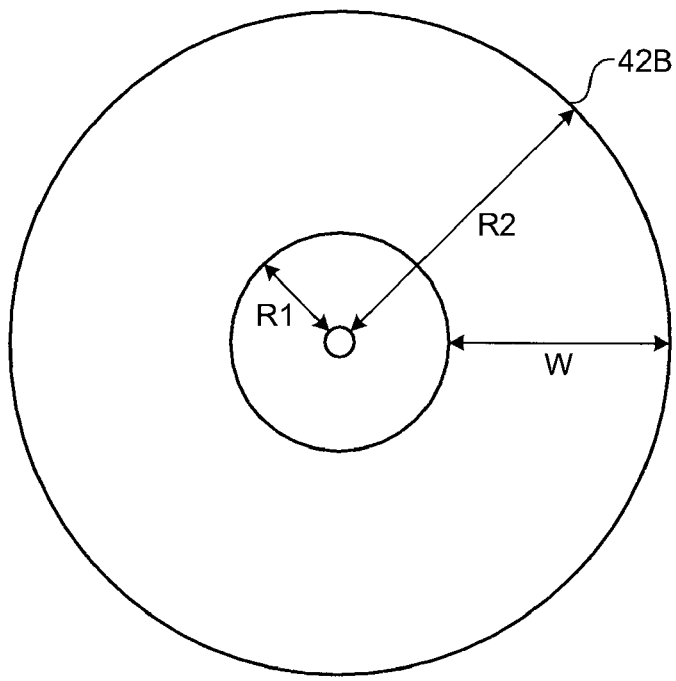

In the case of the bridge error, the processing for creating an evaluation target cell pattern with peripheral environment pattern is performed in the same manner as the case of the neck error. However, a peripheral environment pattern for bridge different from the peripheral environment pattern for neck is used. FIGS. 4A and 4B are diagrams of an example of the peripheral environment pattern for bridge. In the example shown in FIG. 4A, a peripheral environment pattern for bridge 42A in under condition assumes a circular shape. Optimum values of the radius R1 and the width W of the peripheral environment pattern for bridge 42A are also different depending on a layer and a process of an evaluation target cell pattern. Therefore, values that can increase the thickness of a pattern arranged in the center most are calculated by an experiment in advance for each of conditions such as the layer and the process of the evaluation target cell pattern.

In the example shown in FIG. 4B, a peripheral environment pattern for bridge 42B in over condition assumes a ring shape. Optimum values of the radius R1 of an inner circumference of a ring of the peripheral environment pattern for bridge 42B, the radius R2 of an outer circumference of the ring, and the width w of the ring are also different depending on a layer and a process of an evaluation target cell pattern. Therefore, values that can increase the thickness of a pattern arranged in the center most are calculated by an experiment in advance for each of conditions such as the layer and the process of the evaluation target cell pattern.

Figure 5:
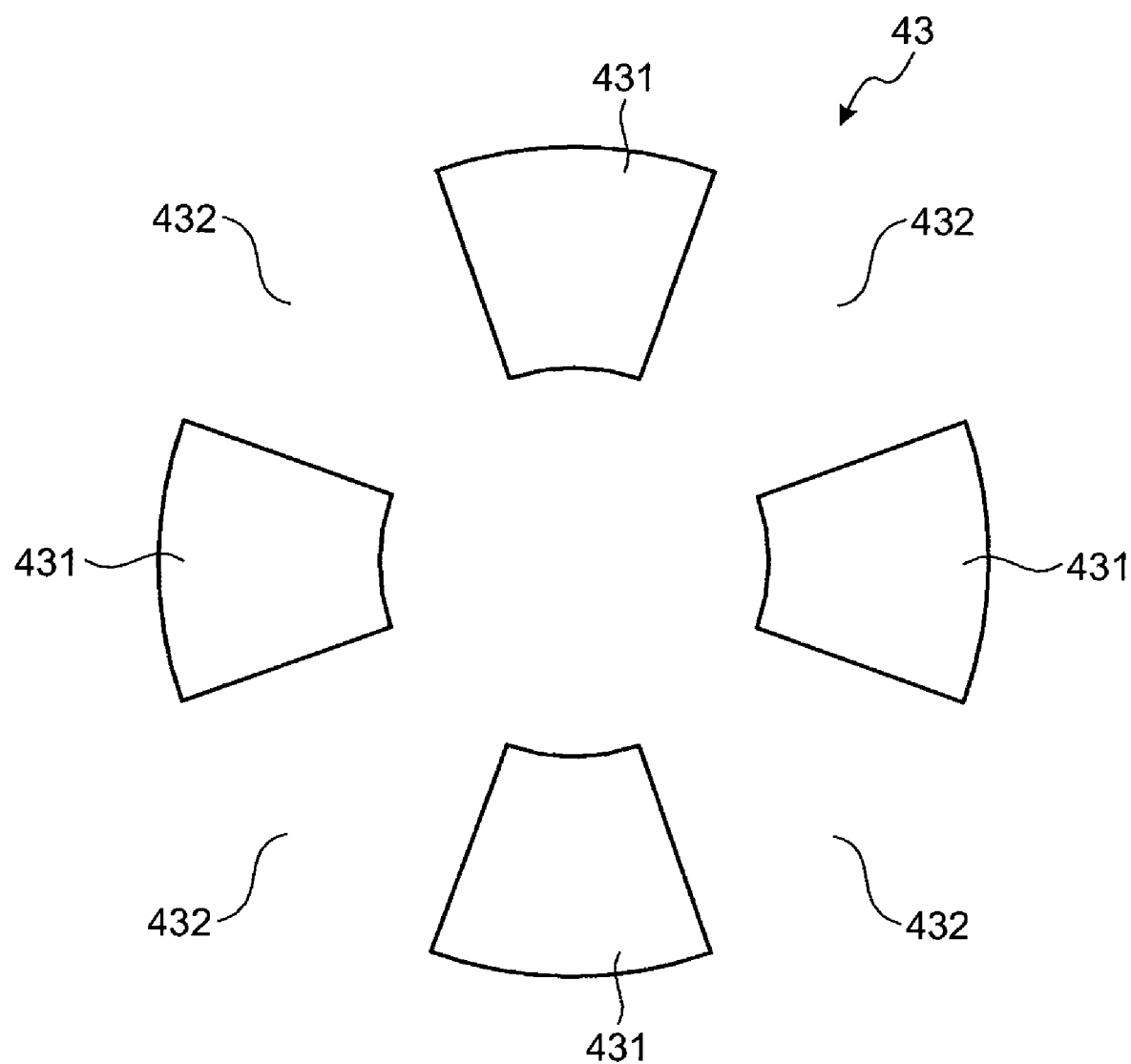
FIG. 5 is a diagram of another example of a peripheral environment pattern for neck.

The peripheral environment pattern that deteriorates the pattern in the center explained above is calculated based on a certain evaluation function. Such a peripheral environment pattern also changes according to an exposure condition of a light source and the like. FIG. 5 is a diagram of another example of the peripheral environment pattern for neck. For example, the peripheral environment pattern for neck 41 explained with reference to FIG. 3B is a peripheral environment pattern obtained when a usual one-eye light source is used. When a four-eye (Quasar type) light source is used, a pattern having a shape shown in FIG. 5 is obtained. The pattern has a structure obtained by leaving patterns 431 in positions corresponding to the light source (positions where light is transmitted) and removing patterns in positions without the light source (positions where light is not transmitted) 432 in the peripheral environment pattern for neck 41 shown in FIG. 3B.

In the above explanation, the peripheral environment pattern is arranged to set the center thereof in the position of the marginal error pattern of the evaluation target cell pattern. The peripheral environment pattern in the position overlapping the evaluation target cell pattern is removed to create a new evaluation target cell pattern. However, a predetermined range from an outer edge of the evaluation target cell pattern can be provided as a peripheral environment pattern generation prohibited area. In this case, the peripheral environment pattern generation prohibited area is provided around the evaluation target cell pattern. In this state, the center position of the peripheral environment pattern is arranged in the position of the marginal error pattern in the evaluation target cell pattern and the processing for creating a new evaluation target cell pattern is performed.

Unless such a peripheral environment pattern generation prohibition area is not provided, it is likely that a peripheral environment pattern is arranged near the evaluation target cell pattern and a pattern against design rules is created. Interference is caused between a peripheral environment pattern of a ring shape or the like and an actual evaluation target cell pattern. Further, when a peripheral environment pattern is arranged, it is likely that a pattern is created between the peripheral environment pattern and the evaluation target cell pattern. Therefore, the problems can be prevented by providing the peripheral environment pattern generation prohibited area in the predetermined range from the outer edge of the evaluation target cell pattern.

In the above example, the peripheral environment pattern is arranged to overlap the evaluation target cell pattern with the center position thereof set in the position of the marginal error pattern to form a new evaluation target cell pattern. However, a new evaluation target cell pattern can be formed by other methods. FIGS. 6A to 6D are schematic diagrams of another example of a specific procedure of the pattern data creating method performed when a neck error occurs. A peripheral environment pattern for neck is managed as a mesh pattern.

Processing for extracting the selected marginal error patterns 31A, 31B, and 31C is the same as the processing explained with reference to FIG. 3A. One of the marginal error patterns 31A, 31B, and 31C shown in FIG. 6A is selected. It is assumed that the marginal error pattern 31C is selected. The marginal error pattern 31C is a section that changes to a neck error. Therefore, a peripheral environment mesh pattern for neck 45 shown in FIG. 6B is generated. In FIG. 6B, a pattern image to be generated is shown. The peripheral environment mesh pattern for neck 45 is a ring-like pattern. The peripheral environment mesh pattern for neck 45 is sectioned by meshes to specify coordinate positions of sections forming the ring. In the peripheral environment mesh pattern for neck 45 shown in FIG. 6B, as shown in FIG. 6C, presence or absence of patterns is managed according to coordinates. In FIG. 6B, a left to right direction on a paper surface is set as an X axis and an up to down direction thereof is set as a Y axis. "0" is input to sets of (X, Y) as a value when a pattern is not present. "1" is input as a value when a pattern is present. A unit is "$\mu m$".

Subsequently, as shown in FIG. 6D, the peripheral environment mesh pattern for neck 45 is arranged to overlap the evaluation target cell pattern with a center 45a thereof set in a position of the selected marginal error pattern 31C. Only meshes in a section overlapping the evaluation target cell pattern 30 among the meshes forming the ring-like pattern are removed. In other words, a new evaluation target cell pattern can be created by removing, with the position of the selected marginal error pattern 31C set as the origin, data of coordinate positions where the evaluation target cell pattern 30 is arranged. In a peripheral environment pattern for bridge, a new evaluation target cell pattern can be created in the same manner.

Figure 7:
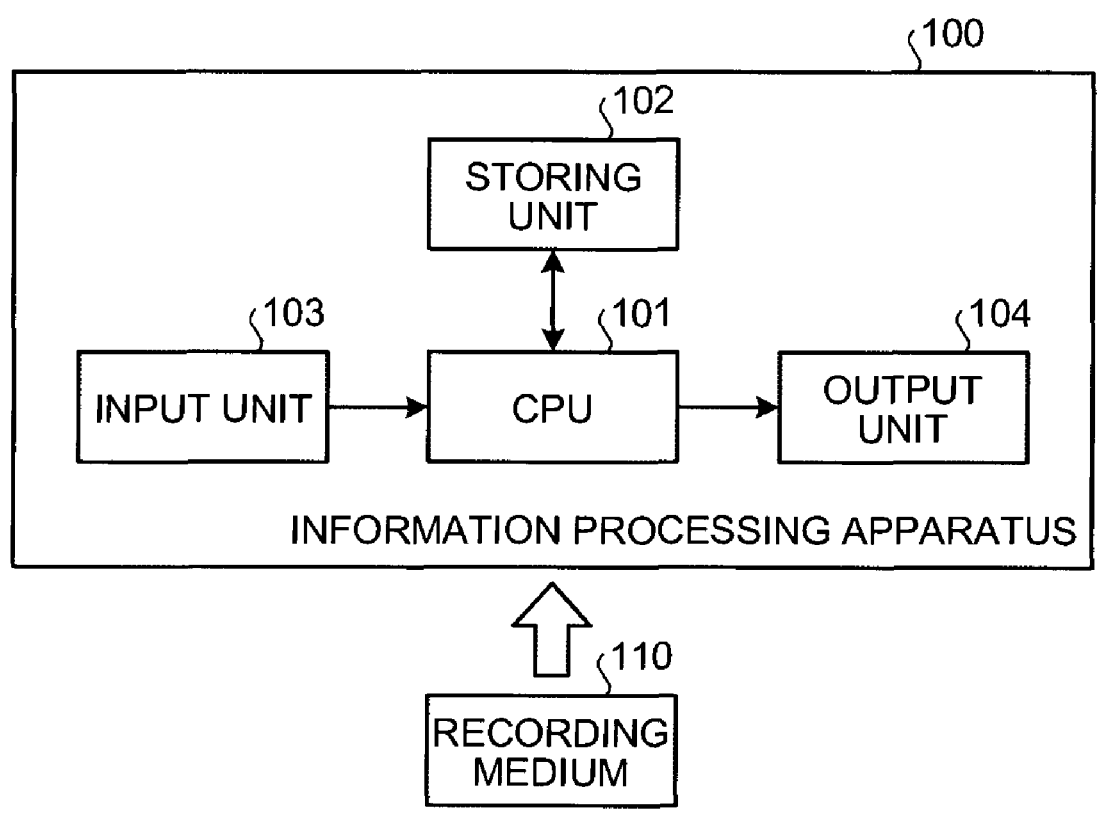
FIG. 7 is a schematic diagram of a configuration of an information processing apparatus that executes the pattern data creating method according to the first embodiment.

FIG. 7 is a schematic diagram of a configuration of an information processing apparatus that executes the pattern creating method according to the first embodiment. As shown in FIG. 7, an information processing apparatus 100 includes at least a central processing unit (CPU) 101, a storing unit 102, an input unit 103, and an output unit 104.

The storing unit 102 includes a read only memory (ROM) and a random access memory (RAM). The storing unit 102 temporarily stores an execution program for causing the information processing apparatus 100 to execute the pattern data creating method stored in a recording medium 110 explained later.

The ROM stores a control program and the like used by the CPU 101. The RAM is a volatile memory and used as a work area for the CPU 101. The ROM stores various computer programs such as the control program.

The CPU 101 manages the operation of the entire information processing apparatus 100. For example, when the information processing apparatus 100 receives power supply, the CPU 101 loads firmware (the control program) stored in the ROM onto the RAM and executes predetermined processing. The CPU 101 executes the processing of the pattern data creating method according to the control program and the execution program read out from the storage medium.

The input unit 103 has a function of an interface that inputs, for example, conditions and numerical values necessary for the predetermined processing. The output unit 104 outputs various kinds of information such as the progress, a result, and the like of the processing. The output unit 104 can include a display and the like that output these kinds of information.

The execution program is stored in the recording medium 110. The execution program can be stored in a fixed disk such as a magnetic disk (a hard disk) as a part of the storing unit 102. As the recording medium 110, magnetic disks such as a flexible disk, optical disks such as a compact disk (CD) and a digital versatile disk (DVD), magneto-optical disks, semiconductor memories, and the like can be used. The execution program can be transmitted to the information processing apparatus via a communication line (a wire line or a wireless line) such as the Internet.

According to the first embodiment, a pattern, a result of the lithography evaluation for which is not a fatal error but is a value close to the fatal error, is extracted from evaluation target cell patterns as a marginal error pattern. In the position of the marginal error pattern, a peripheral environment pattern that deteriorates transfer fidelity to be lower than that of the present peripheral environment pattern is arranged in a position other than an evaluation target cell pattern formation position of the marginal error pattern to form a new evaluation target cell pattern. The evaluation target cell pattern is corrected to prevent the marginal error pattern to be extracted. This makes it possible to prevent occurrence of a fatal error due to an unexpected peripheral pattern when evaluation target cell patterns are laid out in an actual product.

In the past, to prevent a fatal error due to an unexpected peripheral pattern, peripheral patterns of an infinite number of combinations have to be arranged around the marginal error pattern and evaluated. This is unrealistic because time required for processing is an astronomical figure. However, in the first embodiment, evaluation is performed by using a pattern that deteriorates transfer fidelity in the position of the marginal error pattern. Therefore, there is an effect that evaluation time can be reduced compared with that in the past.

Figure 8:
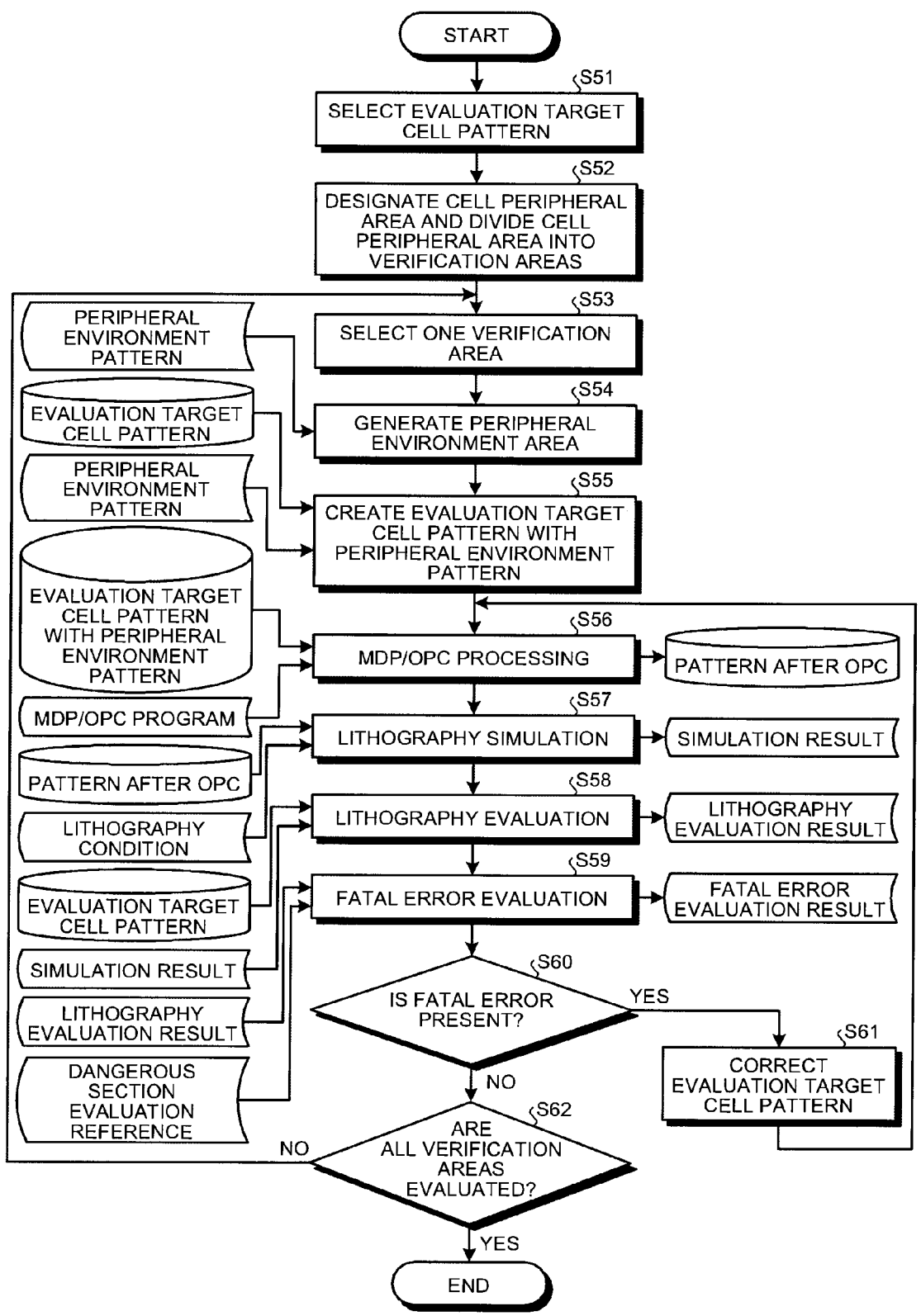
FIG. 8 is a flowchart for explaining an example of a procedure of a pattern data creating method according to the second embodiment.

FIG. 8 is a flowchart for explaining an example of a procedure of a pattern data creating method according to a second embodiment of the present invention. First, one evaluation target cell pattern as input data and an evaluation target is selected (step S51). Subsequently, a cell peripheral area as an area affected by a peripheral environment pattern arranged around the selected evaluation target cell pattern is designated and divided into a plurality of verification areas (step S52).

Figure 9:
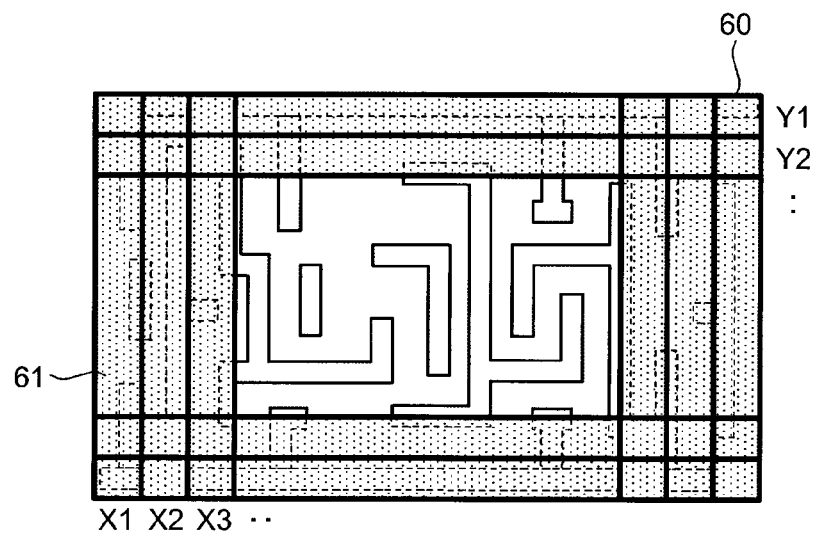
FIG. 9 is a diagram of an example of division of a cell peripheral area.

FIG. 9 is a diagram of an example of the division of the cell peripheral area. As shown in the figure, a cell peripheral area 61 is formed in a picture frame shape in a marginal section of an evaluation target cell pattern 60. In FIG. 9, a left to right direction of a paper surface is set as an X axis direction and an up to down direction thereof is set as a Y axis direction. In the cell peripheral area 61, a plurality of rectangular verification areas X1, X2, X3, . . . having the same length as the length in the Y axis direction of the evaluation target cell pattern 60 and having predetermined width in the X axis direction are formed. Further, in the cell peripheral area 61, a plurality of rectangular verification areas Y1, Y2, . . . having the same length as the length in the X axis direction of the evaluation target cell pattern 60 and having predetermined width in the Y axis direction are formed.

Thereafter, one verification area is selected out of the verification areas X1, X2, X3, . . . and Y1, Y2, . . . (step S53). A peripheral environment pattern that accelerates a neck section or a bridge section included in the verification area in a direction not satisfying provisions is generated (step S54). The peripheral environment pattern to be generated is a pattern with which a transfer shape included in the selected verification area deteriorates transfer fidelity of the neck section or the bridge section most. The peripheral environment pattern is calculated by an experiment in advance. A peripheral environment pattern for neck error detection and a peripheral environment pattern for bridge error detection are generated for one verification area.

Figure 10:
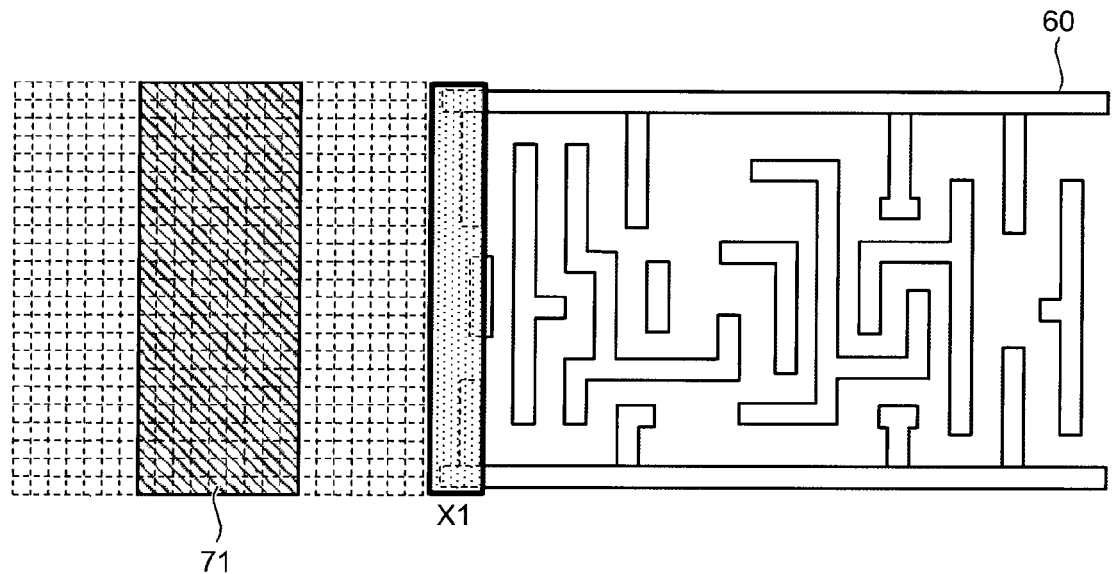
FIG. 10 is a diagram of an example of a peripheral environment pattern.

FIG. 10 is a diagram of an example of the peripheral environment pattern. In the example, the verification area X1 is selected. The example is an example of a peripheral environment pattern 71 with which a transfer shape by simulation or the like included in the verification area X1 accelerates a section, which changes to a neck section, in a direction in which the section is reduced in thickness. The size of the peripheral environment pattern 71 and a distance from the verification area X1 are calculated in advance by an experiment such that the transfer shape by simulation or the like included in the verification area X1 can reduce the thickness of the section, which changes to the neck section, most. The size of the peripheral environment pattern 71 and the distance from the verification area are different depending on a layer, a process, and the like and are calculated in advance for each layer, process, and the like.

Thereafter, an evaluation target cell pattern with peripheral environment pattern is created by using an evaluation target cell pattern and a generated environment pattern (step S55). The evaluation target cell pattern with peripheral environment pattern is formed by arranging a peripheral environment pattern around an evaluation target cell pattern set in advance according to conditions such as a verification area and an error pattern to be generated and, when the peripheral environment pattern overlaps the evaluation target cell pattern, removing the overlapping peripheral environment pattern.

Subsequently, the MDP/OPC processing is applied to the evaluation target cell pattern with peripheral environment pattern (step S56) to generate a pattern after OPC. Thereafter, the lithography simulation is performed using, as input data, mask pattern data based on the generated pattern after OPC and various lithography conditions in which a dosage of light on a resist film, a state of focus, and the like (step S57) to obtain a simulation result.

The lithography evaluation is performed by using the simulation result and the evaluation target cell pattern with peripheral environment pattern (step S58) to obtain a lithography evaluation result. Specifically, a difference between the evaluation target cell pattern and the simulation result obtained by applying the lithography simulation to the pattern after OPC is calculated. The difference is set as a lithography evaluation result.

Fatal error evaluation is performed by using the lithography evaluation result and a dangerous section evaluation reference as input data (step S59) to obtain a fatal error evaluation result. The fatal error evaluation is evaluation for determining whether the difference between the evaluation target cell pattern and the simulation result is within an allowable fluctuation amount set in advance.

Thereafter, it is determined according to the fatal error evaluation result whether a fatal error is present (step S60).

When a fatal error is present ("Yes" at step S60), the evaluation target cell pattern is corrected (step S61). Examples of the correction of the evaluation target cell pattern include correction of a design pattern and correction of OPC. When a plurality of marginal error patterns are extracted, the correction is performed for a plurality of sections. Thereafter, the processing returns to step S56. The processing is repeatedly performed until the fatal error is removed.

Thereafter, when a fatal error is not present ("No" at step S60), it is determined whether all verification areas in the cell peripheral area are evaluated (step S62). When all the verification areas are not evaluated ("No" at step S62), the processing returns to step S53. The processing is performed for all the verification areas. When the evaluation ends for all the verification areas ("Yes" at step S62), the pattern data creating method ends.

In the second embodiment, as in the first embodiment, the pattern data creating method can be executed by an information processing apparatus. The pattern data creating method can also be realized by an execution program for causing the information processing apparatus to execute the processing.

According to the second embodiment, a cell peripheral area affected by patterns arranged around an evaluation target cell pattern is divided into a plurality of verification areas. Lithography verification is performed by arranging a peripheral environment pattern with which a transfer shape by simulation or the like included in each of the verification areas accelerates a section, which changes to a neck section, to be reduced in thickness or the transfer shape by simulation or the like accelerates a section, which changes to a bridge section, to be increased in thickness. As a result, there is an effect that the evaluation target cell pattern can be corrected without extracting a fatal pattern or a marginal pattern, which does not change to the fatal error but tends to nearly change to the fatal error when a condition is changed, included in a cell peripheral area.

The pattern data creating method can be applied to a semiconductor device manufacturing method. Specifically, a pattern is generated by using the method according to the embodiments and a photomask is manufactured based on the generated pattern. Subsequently, a mask pattern formed on the photomask is transferred onto a photoresist on a wafer and developed to form a photoresist pattern. A desired pattern can be formed on the wafer and a semiconductor device can be manufactured by performing etching using the photoresist pattern as a mask.

In the example explained above, the lithography simulation in the lithography process is performed and a result of the lithography simulation is evaluated. However, the present invention is not limited to this example. The present invention can be applied in the same manner when process simulation including at least one of a mask process, a lithography process, and an etching process is performed and a result of the process simulation is evaluated.

As explained above, according to the embodiments of the present invention, there is an effect that it is possible to provide a pattern data creating method and a pattern data creating program that can prevent occurrence of a fatal error when a semiconductor manufacturing process is carried out based on an evaluation target cell pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern data creating method comprising:
acquiring a first simulation result obtained by applying process simulation to a first mask pattern data based on a first evaluation target cell pattern on evaluation target data, by using a computer;
evaluating, whether marginal error patterns as sections in the first evaluation target cell pattern having insufficient margins are present using the first simulation result;
extracting the marginal error patterns;
creating a second evaluation target cell pattern with deteriorating transfer fidelity pattern in which a deteriorating transfer fidelity pattern is arranged with respect to the marginal error patterns such that a second simulation result obtained when a second mask data pattern is created and the process simulation is applied to the second mask pattern data is more deteriorated than the first simulation result; and
determining whether a fatal error is present using a result obtained by applying the process simulation to the second mask pattern data based on the second evaluation target cell pattern with deteriorating transfer fidelity pattern and correcting, when the fatal error is present, the second evaluation target cell pattern including the marginal error patterns or the second mask pattern data based on the second evaluation target cell pattern.

2. The mask pattern data creating method according to claim 1, wherein the deteriorating transfer fidelity pattern is a pattern that can deteriorate, when a degree of reproduction of a design pattern into a transfer pattern is referred to as pattern transfer fidelity, pattern transfer fidelity of the marginal error patterns more than pattern transfer fidelity of the marginal error patterns in the deteriorating transfer fidelity pattern at a point when the marginal error patterns are extracted.

3. The mask pattern data creating method according to claim 2, wherein, when a simulation result of the marginal error patterns indicates a neck section, the deteriorating transfer fidelity pattern is a ring-shaped pattern and, when a simulation result of the marginal error patterns indicates a bridge section, the deteriorating transfer fidelity pattern is a ring-shaped pattern or a circular pattern.

4. The mask pattern data creating method according to claim 3, wherein, when a light source used for exposure is a four-eye light source, the deteriorating transfer fidelity pattern has structure obtained by removing patterns in positions without the light source.

5. The mask pattern data creating method according to claim 1, wherein a center of the deteriorating transfer fidelity pattern is arranged to be set on one of the marginal error patterns in the first evaluation target cell pattern to create the second evaluation target cell pattern with deteriorating transfer fidelity pattern from which a pattern in a section overlapping the first evaluation target cell pattern of the deteriorating transfer fidelity pattern is removed.

6. The mask pattern data creating method according to claim 5, wherein
a deteriorating transfer fidelity pattern generation prohibited area is arranged in a predetermined range from an outer edge of the first evaluation target cell pattern, and the second evaluation target cell pattern with deteriorating transfer fidelity pattern is a pattern obtained by removing a pattern of a section overlapping the deteriorating transfer fidelity pattern generation prohibited area.

7. The mask pattern data creating method according to claim 1, wherein the marginal error patterns are evaluated according to whether a difference of parameters between the first simulation result and the second mask pattern data based on the second evaluation target cell pattern is included in a marginal error pattern evaluation reference set in a predetermined range in an allowable fluctuation amount, with which a predetermined device characteristic can be obtained, including an upper limit value of the allowable fluctuation amount and a predetermined range in the allowable fluctuation amount including a lower limit value.

8. The mask pattern data creating method according to claim 7, wherein the marginal error pattern evaluation reference is set to a different value depending on a position in the second evaluation target cell pattern.

9. A semiconductor device manufacturing method comprising forming, on a semiconductor substrate, a pattern created by the pattern data creating method according to claim 1.

10. A computer program product having a non-transitory computer-readable recording medium including a plurality of commands for creating process models creating a mask pattern for executing by a computer, the commands causing the computer to execute:
evaluating whether marginal error patterns as sections in a first evaluation target cell pattern having insufficient margins are present, using a first simulation result obtained by applying process simulation to a first mask pattern data based on the first evaluation target cell pattern on data;
extracting the marginal error patterns;
creating a second evaluation target cell pattern with deteriorating transfer fidelity pattern in which a deteriorating transfer fidelity pattern is arranged with respect to the marginal error patterns such that a second simulation result obtained when a second mask data pattern is created and the process simulation is applied to the second mask pattern data is more deteriorated than the first simulation result;
determining whether a fatal error is present using a result obtained by applying the process simulation to the second mask pattern data based on the second evaluation target cell pattern with deteriorating transfer fidelity pattern; and
correcting, when the fatal error is present, the second evaluation target cell pattern including the marginal error patterns or the second mask pattern data based on the second evaluation target cell pattern.

11. The computer program product according to claim 10, wherein, when a simulation result of the marginal error patterns indicates a neck section, the deteriorating transfer fidelity pattern is a ring-shaped pattern and, when a simulation result of the marginal error patterns indicates a bridge section, the deteriorating transfer fidelity pattern is a ring-shaped pattern or a circular pattern.

12. The computer program product according to claim 10, wherein a center of the deteriorating transfer fidelity pattern is arranged to be set on one of the marginal error patterns in the first evaluation target cell pattern to create the second evaluation target cell pattern with deteriorating transfer fidelity pattern from which a pattern in a section overlapping the first evaluation target cell pattern of the deteriorating transfer fidelity pattern is removed.

13. The computer program product according to claim 12, wherein
a deteriorating transfer fidelity pattern generation prohibited area is arranged in a predetermined range from an outer edge of the first evaluation target cell pattern, and the second evaluation target cell pattern with deteriorating transfer fidelity pattern is a pattern obtained by removing a pattern of a section overlapping the deteriorating transfer fidelity pattern generation prohibited area.

14. The computer program product according to claim 10, wherein the deteriorating transfer fidelity pattern is managed by meshes, a center of the mesh deteriorating transfer fidelity pattern is set on one of the marginal error patterns, and only meshes in a section overlapping the first evaluation target cell pattern among the meshes forming the pattern are removed to create the second evaluation target cell pattern with deteriorating transfer fidelity pattern.

15. The computer program product according to claim 10, wherein the marginal error patterns are evaluated according to whether a difference of parameters between the first simulation result and the second mask pattern data based on the second evaluation target cell pattern is included in a marginal error pattern evaluation reference set in a predetermined range in an allowable fluctuation amount, with which a predetermined device characteristic can be obtained, including an upper limit value of the allowable fluctuation amount and a predetermined range in the allowable fluctuation amount including a lower limit value.

\* \* \* \* \*